United States Patent [19]

Cricchi et al.

[11] 4,148,049
[45] Apr. 3, 1979

[54] RADIATION HARDENED DRAIN-SOURCE PROTECTED MNOS TRANSISTOR

[75] Inventors: James R. Cricchi, Catonsville; Franklyn C. Blaha; Michael D. Fitzpatrick, both of Glen Burnie, all of Md.

[73] Assignee: Westinghouse Electric Corp., Pittsburgh, Pa.

[21] Appl. No.: 765,484

[22] Filed: Feb. 4, 1977

Related U.S. Application Data

[63] Continuation of Ser. No. 563,423, Mar. 28, 1975, abandoned.

[51] Int. Cl.² ............................................. H01L 29/78
[52] U.S. Cl. ........................................ 357/23; 357/52; 357/54
[58] Field of Search ............................ 357/23, 54, 52

[56] References Cited

U.S. PATENT DOCUMENTS 3,836,894  9/1974  Cricchi .................................. 357/23

Primary Examiner—Edward J. Wojciechowicz
Attorney, Agent, or Firm—J. B. Hinson

[57] ABSTRACT

A radiation hardened drain-source protected MNOS transistor is disclosed. A layer of silicon oxide overlies the channel and the junctions formed by the intersections of the drain and source regions with the channel. Drain and source protection is provided by relatively thick portions of the silicon oxide layer which overlie the junctions formed by the drain and source regions and the channel. The portion of the silicon oxide layer overlying the central section of the channel is thinner than the remainder of this layer.

A silicon nitride layer and an electrically conductive layer forming the gate electrode overlie the thinner portion of the silicon oxide layer to complete the MNOS transistor. The conductive layer forming gate electrode of the transistor is in electrical contact with both the silicon nitride and the silicon oxide layers. This provides a convenient method for electrons generated at the interface of the silicon and the silicon-oxide layer during irradiation to be transported to the gate, thereby preventing charge build-up in the silicon oxide which causes shifts in the characteristics of the transistor.

5 Claims, 2 Drawing Figures

RADIATION HARDENED DRAIN-SOURCE PROTECTED MNOS TRANSISTOR

STATEMENT OF GOVERNMENT INTEREST

The disclosed and claimed herein was either first conceived or reduced to practice under Contract F33615-73-C-1093 with the U.S. Air Force.

This is a continuation of application Ser. No. 563,423 filed Mar. 28, 1975, now abandoned.

BACKGROUND OF THE INVENTION

1. Field of the Invention

The invention relates to semiconductor devices, and more particularly, to radiation hardened drain source protected MNOS transistors.

2. Description of the Prior Art

Typical prior art drain source protected MNOS transistors included a layer of silicon oxide interposed between the semiconductor substrate and the silicon nitride layer. These devices also included a silicon nitride layer interposed between the conductive layer forming the gate terminal and the silicon oxide layer providing electrical insulation between these layers. When these prior art devices are subjected to relatively high radiation levels, electrical charges are believed to build up in the silicon oxide layer causing the electrical characteristics of the transistor to shift. This shift is relatively permanent, and could result in limiting the application of the prior art devices to situations in which these devices were subjected to relatively low radiation levels.

SUMMARY OF THE INVENTION

Although the precise mechanism causing degradation of prior art drain-source protected MNOS transistors due to radiation is not completely understood, it is believed to be related to the accumulation of electrons in the silicon oxide during irradiation and the inability to discharge these electrons to the gate through the silicon nitride layer. In the disclosed transistor, this difficulty is substantially overcome by providing a gate electrode which electrically contacts both the silicon nitride and silicon oxide layers. This provides a means for the charges which build up in the silicon oxide layer during irradiation to be discharged to the gate electrode. This significantly reduces the sensitivity of the device to radiation.

DETAILED DESCRIPTION

Figure 1:
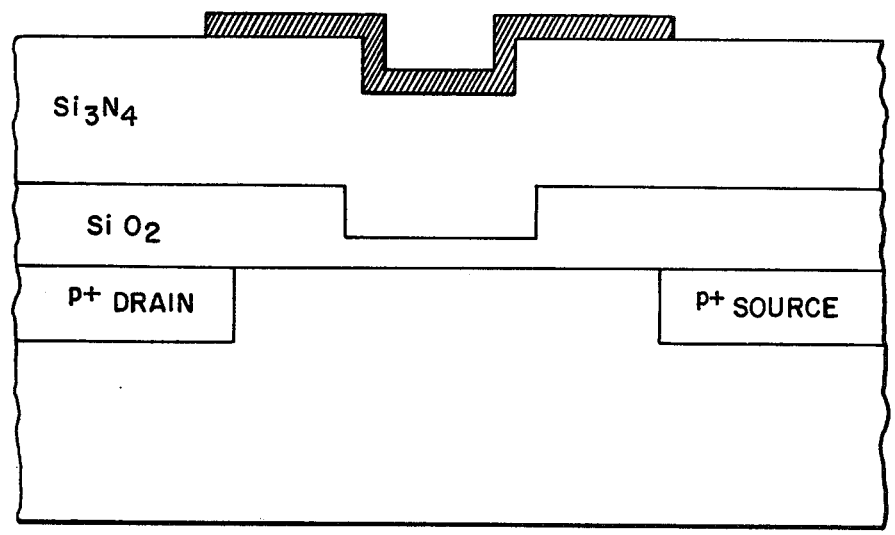
FIG. 1 is a cross-sectional view of prior art drain-source protected MNOS transistor.

FIG. 1 is a cross-section view of a typical prior art drain-source protected MNOS transistor. This device is well known in the prior art and for purposes of simplifying this application will not be described in detail. A detailed description of the operation of this device can be found in U.S. Pat. No. 3,719,866, issued to Naber et al.

Figure 2:
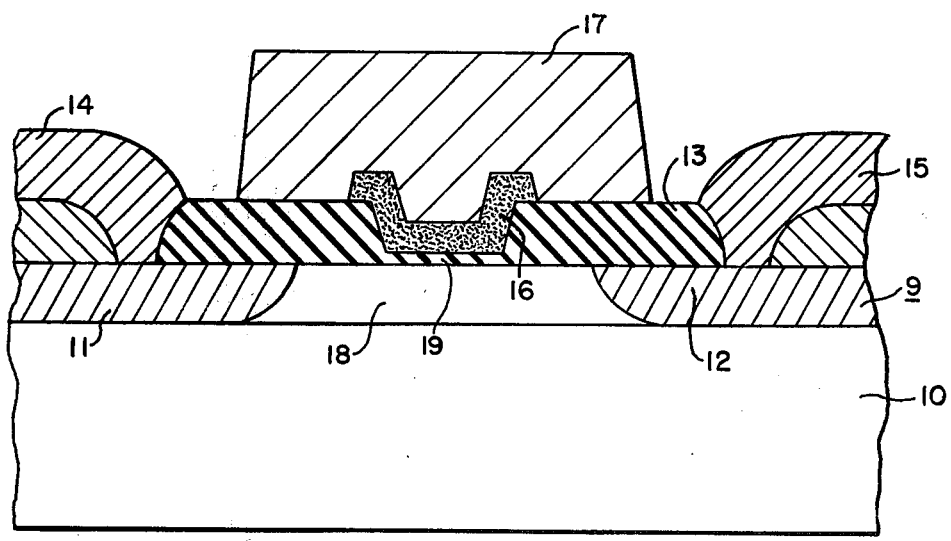
FIG. 2 is a cross-sectional view of the radiation hardened drain-source protected MNOS transistor.

The preferred embodiment of the radiation hardened MNOS transistor is illustrated in cross-section in FIG. 2. The transistor utilizes a thin semiconductor layer 9 supported by an insulating substrate 10. In the preferred embodiment the substrate 10 is a highly electrically insulating material such as sapphire. The thin layer of semiconductor material 9, silicon for example, may be epitaxially grown on one surface of the insulating substrate 10. Assuming that the semiconductor layer 9 is of N conductivity type, P conductivity type drain and source regions, 11 and 12, are formed in the semiconductor layer 9 by selective diffusions or other suitable processes. Region 18 of the semiconductor layer 9 between the drain region 11 and the source region 12 forms the channel of the transistor. The insulating substrate 10 can be deleted if a semiconductor layer not requiring mechanical support is utilized.

A first electrically insulating layer 13 of silicon oxide, for example, selectively covers the top surface of the semiconductor layer 9. Two openings in the silicon oxide layer 13 provide access for electrical contact to the drain and source regions, 11 and 12. Electrical contact is made to the drain and source regions, 11 and 12, by conductive layers 14 and 15. The silicon oxide layer 13 also includes a thin region 19 substantially centered between the drain and source regions, 11 and 12, but not overlapping the junctions formed by the channel 18 and the drain and source regions, 11 and 12. A layer of silicon nitride 16 overlies this thin region 19 and slightly overlaps the thicker portions of the silicon oxide layer 13. An electrically conductive layer 17 forming the gate electrode of the transistor covers and overlaps the edges of the silicon nitride layer 16 providing conductive electrical contact between the gate electrode and the silicon oxide layer 13. Electrical contacts are made to the transistor through the conductive layers 14, 15 and 17.

Conventional MNOS transistors are believed to be sensitive to radiation because electrical charges build up in the silicon oxide layer when these devices are subjected to radiation. In prior art MNOS transistors, the silicon nitride layer electrically insulates the gate electrode from the silicon oxide layer preventing these charges from migrating to the gate. This type of charge build-up is prevented in the disclosed transistor because the electrically conductive layer 17 forming the gate electrode is in direct electrical contact with the thick portions of the silicon oxide layer 13, providing a convenient discharge path for any charges which may be created in the silicon oxide layer 13 due to radiation.

Typical dimensions for the radiation hardened MNOS transistor are as follows:
1. Channel width $\approx 12\ \mu m$
2. Width of thin portion of silicon oxide $\approx 6\ \mu m$
3. Thickness of silicon oxide in region of drain and source junctions $\approx 800\text{Å}$
4. Thickness of silicon oxide overlying central portion of channel $\approx 20\text{Å}$
5. Thickness of silicon nitrode layer $\approx 500\text{Å}$ After the silicon oxide and silicon nitride layers have been formed, the exposed portion of the silicon oxide layer can be selectively doped to further radiation harden the transistor. Typical dopants useful for this purpose include aluminum and chromium. Gas annealing in hydrogen, HCL or nitrogen may also be used to optimize the long term stability of the transistor. Suitable processes for doping and annealing the insulating layers are well known in the prior art.

The disclosed device can be manufactured using conventional semiconductor manufacturing processes. The detailed geometrical configuration may also be varied so long as electrical contact is maintained between the gate terminal and the silicon oxide layer. Although the disclosed radiation hardening technique was illustrated and discussed with reference to a drain-source protected MNOS transistor, the technique is applicable to other semiconductor devices.

We claim:

1. A transistor comprising, in combination:
   a. a semiconductor substrate of a first conductivity type having first and second separated regions of a second conductivity type therein said first and second regions respectively forming drain and source regions having a channel region disposed therebetween;
   b. a first insulating layer selectively overlying said semiconductor substrate, said first insulating layer including thinner and thicker portions, said thinner portion overlying a central portion of said channel region, said thicker portion overlying at least the remainder of said channel region;
   c. a second insulating layer overlying at least said thinner portion of said first insulating layer;
   d. an electrically conductive layer electrically contacting said thick portions of said first insulating layer and overlying said thinner portions of said second insulating layer; and
   e. means for forming electrical connections to said electrically conducting layer and said first and second regions of a second conductivity type.

2. A semiconductor device in accordance with claim 1 wherein: said semiconductor substrate is N conductivity type.

3. A semiconductor device in accordance with claim 2 wherein said first insulating layer is silicon oxide.

4. A semiconductor device in accordance with claim 3 wherein said second insulating layer is silicon nitride.

5. A semiconductor device in accordance with claim 4 wherein said conductive layer is aluminum.

* * * * *